United States Patent
Stikvoort

(10) Patent No.: US 7,375,582 B2
(45) Date of Patent: May 20, 2008

(54) POLYPHASE FILTER WITH INTEGRATORS

(75) Inventor: Eduard Ferdinand Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/510,879

(22) PCT Filed: Mar. 20, 2003

(86) PCT No.: PCT/IB03/01060

§ 371 (c)(1),
(2), (4) Date: Oct. 8, 2004

(87) PCT Pub. No.: WO03/085828

PCT Pub. Date: Oct. 16, 2003

(65) Prior Publication Data

US 2005/0141165 A1    Jun. 30, 2005

(30) Foreign Application Priority Data

Apr. 11, 2002 (EP) .................... 02076438

(51) Int. Cl.
*H03K 5/00* (2006.01)

(52) U.S. Cl. .................... 327/552; 455/313

(58) Field of Classification Search ........ 327/552–559; 455/313, 307
See application file for complete search history.

(56) References Cited

U.S. PATENT DOCUMENTS

| | | | |
|---|---|---|---|
| 4,355,335 A * | 10/1982 | Imaide et al. ............... 348/300 |
| 6,009,349 A * | 12/1999 | Mouchawar et al. .......... 607/6 |
| 6,236,847 B1 * | 5/2001 | Stikvoort .................... 455/313 |
| 6,346,850 B2 * | 2/2002 | Essink ........................ 327/552 |
| 6,388,543 B1 * | 5/2002 | Molnar et al. ............. 333/172 |
| 6,590,943 B1 * | 7/2003 | Ali ............................. 375/332 |
| 6,987,966 B1 * | 1/2006 | Wu et al. ................... 455/420 |

\* cited by examiner

*Primary Examiner*—Dinh T. Le
(74) *Attorney, Agent, or Firm*—Peter Zawilski

(57) ABSTRACT

Polyphase filters comprise a plurality of filters each filter having passive elements. The filters are provided with integrators comprising amplifiers with admittance elements in feedback paths to create one or more other poles not situated on the negative imaginary axis in the plane-zero plot. A conductance element couples an output of an integrator of the integrators to an input of a previous integrator for introducing a frequency shift for at least one pole in the plane pole-zero plot. A capacitor couples an output of the integrator to an input of a next integrator for improving the quality factor of the polyphase filter. A signal inversion allows conductance elements to have negative values necessary for locating at least one pole at the most optimal location in the plane pole-zero plot.

7 Claims, 2 Drawing Sheets

POLYPHASE FILTER WITH INTEGRATORS

Figure 1:
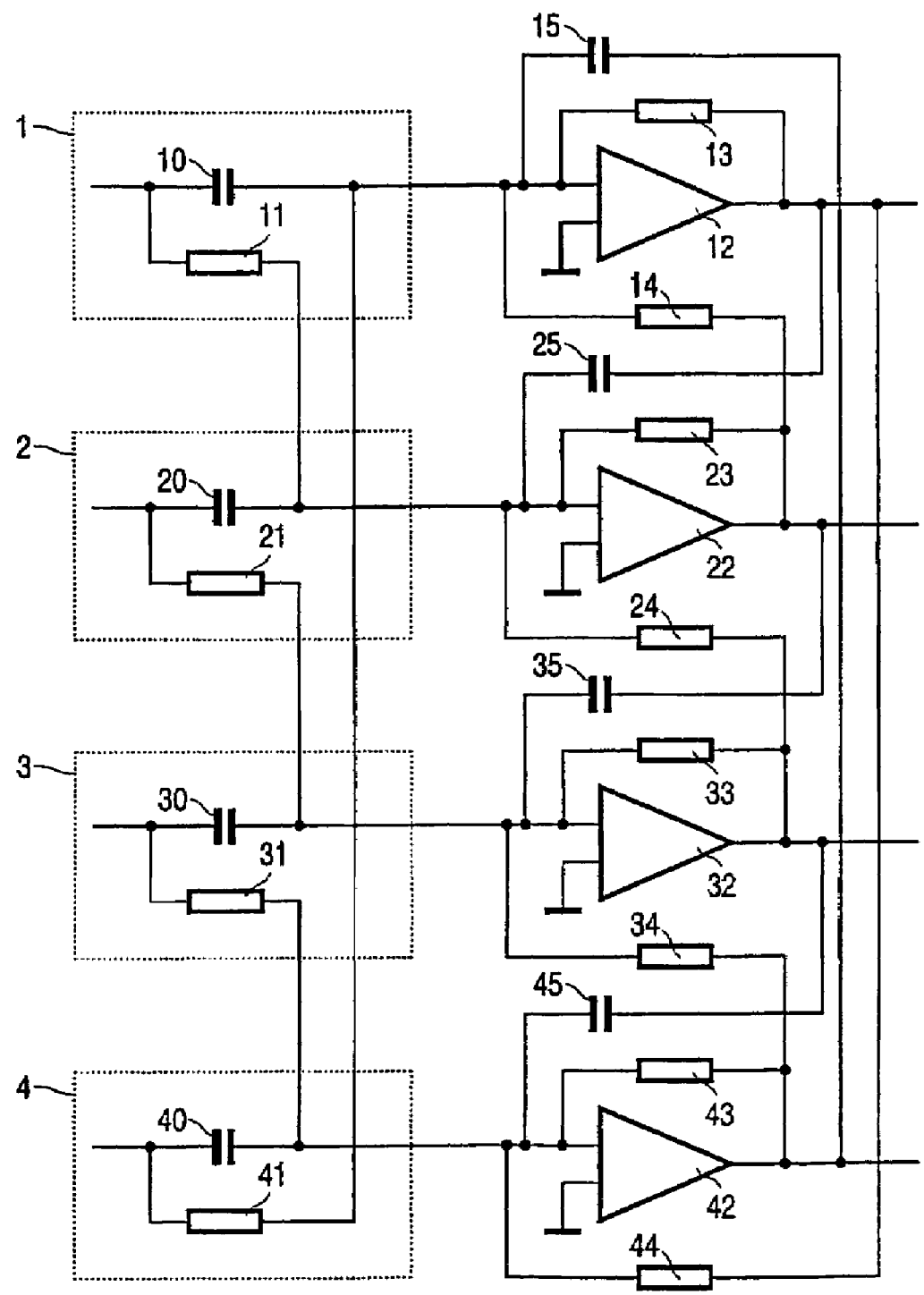

The invention relates to a polyphase filter comprising at least two filters for filtering signals.

The invention also relates to an integrator for use in a polyphase filter comprising at least two filters for filtering signals, and to a receiver comprising a polyphase filter comprising at least two filters for filtering signals.

Such a polyphase filter is for example a two-phase filter comprising two filters for filtering two (input) signals, or a four-phase filter comprising four filters for filtering four (input) signals. Polyphase filters are used, for example, in television receivers, for example in the tuner just before the mixer.

A prior art polyphase filter is known from U.S. Pat. No. 3,559,042, published Jan. 26, 1971, which discloses a polyphase network including N single phase circuits (filters), each circuit having a first impedance coupled between input and output terminals of said circuit, with said input terminal also being coupled to the output terminal of another circuit responding to an adjacent phase (leading or lagging) of the input signal by a second impedance having a different phase angle characteristic than that of the first impedance.

The known polyphase filter is disadvantageous, inter alia, due to, for example in case of being used in a tuner just before the mixer, needing buffers, said buffers limiting the dynamic range of the polyphase filter.

It is an object of the invention, inter alia, of providing a polyphase filter as defined in the preamble which allows the dynamic range to be larger.

The polyphase filter according to the invention is characterized in that said filters are coupled to integrators for integrating filtered signals.

The integrators coupled to said filters allow a larger dynamic range than the known combination of filters and buffers.

The invention is based upon an insight, inter alia, that a known polyphase filter with buffers has a limited dynamic range, and is based upon a basic idea, inter alia, that integrators replacing said buffers allow the dynamic range to be larger.

The invention solves the problem, inter alia, of providing a polyphase filter as defined in the preamble which allows the dynamic range to be larger, and introduces further advantageous functions, as described below.

According to a first embodiment of the polyphase filter according to the invention, an output of an integrator is coupled via a conductance element to an input of a previous integrator.

Said conductance element increases the selectivity of the polyphase filter. In case of a two-phase filter, generally there will be two filters each with an integrator. Then the output of the second integrator is coupled via a first conductance element to the input of the first integrator, and generally the output of the first integrator is coupled via a second conductance element to the input of the second integrator. In case of a four-phase filter, generally there will be four filters each with an integrator. The output of the second integrator is coupled via a first conductance element to the input of the first integrator, and generally the output of the third integrator is coupled via a second conductance element to the input of the second integrator, etc.

According to a second embodiment of the polyphase filter according to the invention an output of an integrator is coupled via a capacitor to an input of a next integrator.

Said capacitor further increases the selectivity of the polyphase filter. In case of a two-phase filter, the output of the first integrator is coupled via a first capacitor to the input of the second integrator, and generally the output of the second integrator is coupled via a second capacitor to the input of the first integrator. In case of a four-phase filter, the output of the first integrator is coupled via a first capacitor to the input of the second integrator, and generally the output of the second integrator is coupled via a second capacitor to the input of the third integrator, etc. Said capacitor improves the quality factor of the polyphase filter, allowing a quality factor larger than $\frac{1}{2}\sqrt{2}$, without making a loop-amplification larger than one in a three-phase, four-phase, five-phase etc. filter.

According to a third embodiment of the polyphase filter according to the invention an integrator comprises an amplifier with an admittance element in a feedback path.

Said integrator is provided with an amplifying function and can be integrated well in an integrated circuit, with said admittance element defining an integration factor.

According to a fourth embodiment of the polyphase filter according to the invention a filter comprises a passive element and an amplifier comprises an operational amplifier.

This polyphase filter based on filters each comprising passive elements and operational amplifiers can be integrated well in an integrated circuit, with each part of said fourth embodiment being a sub-embodiment possibly to be used in combination with one or more other sub-embodiments or not.

According to a fifth embodiment of the polyphase filter according to the invention a passive element comprises a resistor and a capacitor and an admittance element comprises a capacitor and a conductance element coupled in parallel to each other.

This polyphase filter based upon resistors and capacitors and admittance elements comprising capacitors and conductance elements coupled in parallel to each other can be integrated well in an integrated circuit, with each part of said fifth embodiment being a sub-embodiment possibly to be used in combination with one or more other sub-embodiments or not.

According to a sixth embodiment of the polyphase filter according to the invention said polyphase filter comprises at least one signal inversion between integrators.

Said signal inversion allows a conductance element to have a negative value necessary for locating at least one pole at the most optimal location in the plane pole-zero plot. A signal inversion may be realized by exchanging a pair of connections in an integrated circuit (exchanging plus and minus) in case of a balanced polyphase filter or may be realized by an inverter for example comprising an operational amplifier.

It should be noted that the words "previous" and "next" should not be looked at too narrowly and that these words may correspond with "neighboring". Between an integrator and a previous/next/neighboring integrator, there could be located further integrators or not. Usually, but not exclusively, said integrators will be coupled more or less symmetrically.

Embodiments of the integrator according to the invention and of the receiver according to the invention correspond with the embodiments of the polyphase filter according to the invention.

These and other aspects of the invention will be apparent from and elucidated with reference to the embodiments(s) described hereinafter.

Figure 2:
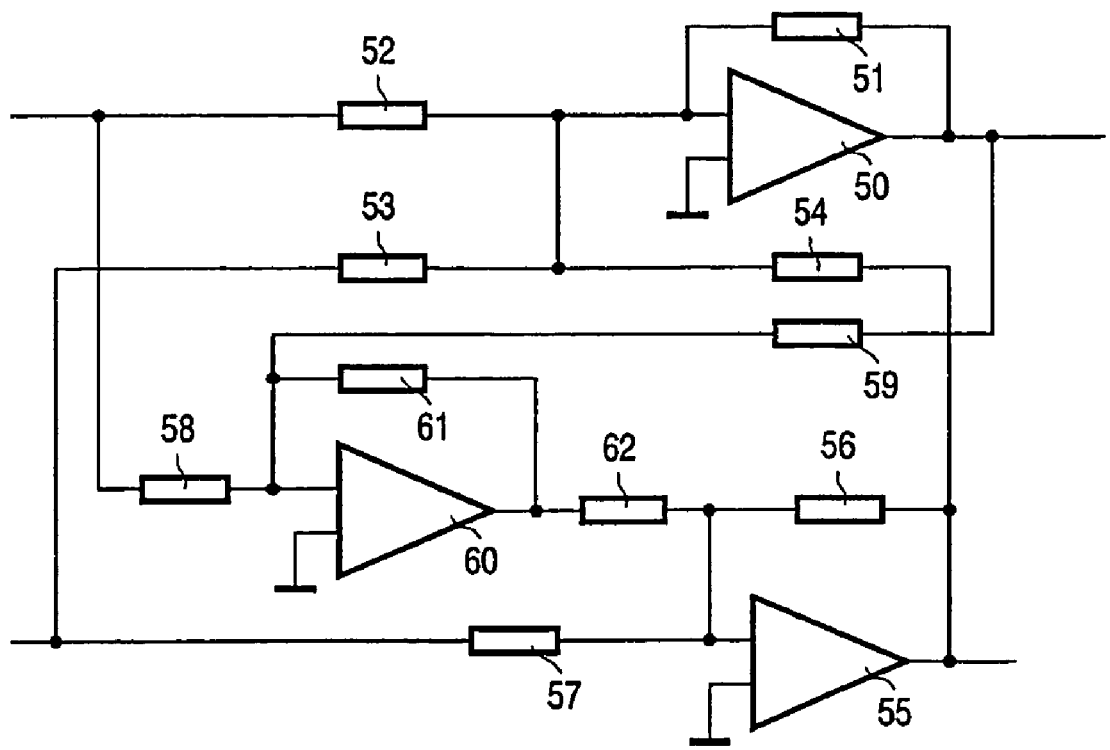

FIG. 1 illustrates in block diagram form a polyphase filter according to the invention comprising four filters and four integrators according to the invention, and FIG. 2 illustrates in block diagram form a polyphase filter according to the invention comprising two filters and two integrators according to the invention with an inverter.

The polyphase filter shown in FIG. 1 comprises four filters 1-4. Filter 1 (2,3,4) comprises a capacitor 10 (20,30, 40) located between an input and an output of filter 1 (2,3,4), with a resistor 11 (21,31,41) being coupled to the input of filter 1 (2,3,4) and to an output of filter 2 (3,4,1). The output of filter 1 (2,3,4) is coupled to a first input of an operational amplifier 12 (22,32,42), of which a second input is coupled to ground and of which an output is coupled via an admittance element 13 (23,33,43) to said first input. Said output is further coupled via a conductance element 44 (14,24,34) to an input of an operational amplifier 42 (12,22,32), and is further coupled via a capacitor 25 (35,45,15) to an input of an operational amplifier 22 (32,42,12).

The output of first (second, third, fourth) filter 1 (2,3,4) is coupled to an input of a first (second, third, fourth) integrator 12-13 (22-23,32-33,42-43) comprising an operational amplifier 12 (22,32,42) with an admittance element 13 (23,33,43) in a feedback path. Other amplifiers like for example a single or a few transistors are however not to be excluded. Said admittance element 13 (23,33,43) for example comprises a capacitor and a conductance element coupled in parallel to each other, but other and/or further admittance elements belong to the possibilities.

The output of first (second, third, fourth) integrator 12-13 (22-23,32-33,42-43) is coupled via a conductance element 44 (14,24,34) to an input of a previous integrator 42-43 (12-13,22-23,32-33), with further elements not to be excluded.

The output of first (second, third, fourth) integrator 12-13 (22-23,32-33,42-43) is coupled via a capacitor 25 (35,45,15) to an input of a next integrator 22-23 (32-33,42-43,12-13), with further elements not to be excluded.

The first (second, third, fourth) filter 1 (2,3,4) comprises passive elements like said capacitor 10 (20,30,40) and said resistor 11 (21,31,41), with other and/or further passive elements not to be excluded. Usually, at least two passive elements in each filter 1,2,3,4 will have a different phase angle characteristic.

Alternatively, instead of a filter 1 (2,3,4) comprising passive elements 10-11 (20-21,30-31,40-41) and being coupled to an integrator 12-13 (22-23,32-33,42-43), a filter 1 (2,3,4) may comprise passive elements 10-11 (20-21,30-31,40-41) and may further comprise an integrator 12-13 (22-23,32-33,42-43) and/or a conductance element (thereby having the option of including either the one coupled to the previous integrator or the one coupled to the next integrator) and/or a capacitor (and thereby again having the option of including either the one coupled to the previous integrator or the one coupled to the next integrator).

Amplifiers with admittance elements in feedback paths introduce poles on the negative real axis in the plane pole-zero plot. The conductance elements introduce frequency shifts of said poles in the plane pole-zero plot. The capacitors also give frequency shifts of said poles in the plane pole-zero plot. Quality factors larger than $\frac{1}{2}\sqrt{2}$ in a four-phase filter now belong to the possibilities.

The polyphase filter shown in FIG. 2 comprises a first (second) operational amplifier 50 (55) of which a first input is coupled to an admittance element 52 (57) and of which a second input is coupled to ground and of which an output is coupled via an admittance element 51 (56) to said first input. Another side of admittance element 52 (57) forms a first (second) input of this polyphase filter. Said output of first (second) operational amplifier 50 (55) forms a first (second) output of this polyphase filter.

Said first input of this polyphase filter is further coupled to a conductance element 58. Another side of the conductance element 58 is coupled to a first input of a third operational amplifier 60. A second input of the third operational amplifier 60 is coupled to ground. An output of the third operational amplifier 60 is coupled via a conductance element 61 to said first input of third operational amplifier 60 and via a conductance element 62 to said first input of second operational amplifier 55. Said first input of third operational amplifier 60 is further coupled via a conductance element 59 to the output of first operational amplifier 50.

Said second input of this polyphase filter is further coupled to a conductance element 53, of which an other side is coupled to said first input of first operational amplifier 50 and via a conductance element 54 to said output of second operational amplifier 55.

Admittance element 52 and conductance element 58 form a first filter, with operational amplifier 50 with admittance element 51 forming a first integrator. Admittance element 57 and conductance element 53 form a second filter, with operational amplifier 55 with admittance element 56 forming a second integrator. Conductance element 54 (59) couples an output of a second (first) integrator to an input of a first (second) integrator.

Third operational amplifier 60 together with conductance elements 61 and 62 forms an inverter located between both integrators and allows conductance elements 58 and 59 to have a negative value necessary for locating at least one pole at the most optimal location in the plane pole-zero plot.

With respect alternatives and/or additions to said operational amplifiers, admittance elements and conductance elements, see above.

Let us consider that the admittance elements 51 and 56 are $Y_b = sC_b + G_{br}$, admittance elements 52 and 57 are $Y_a = sC_a + G_{ar}$, conductance element 53 is $G_a$ and conductance element 58 is $-G_a$, conductance element 54 being $G_b$ and conductance element 59 being $-G_b$. Said negative values are realized via said inverter. The transfer function becomes:

$$Hp(s) = -(sC_a + G_{ar} + jG_a)/(sC_b + G_{br} + jG_b),$$

and a pole can be found at $s_x = -(G_{br} + jG_b)/C_b$, and a zero can be found at $s_o = -(G_{ar} + jG_a)/C_a$.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. Polyphase filter comprising:
    at least two filters, each comprising a series admittance element and a shunt conductance element, each for filtering an input signal to produce a filtered signal at an output;
    at least two integrators, each corresponding to one of said filters and coupled to said one of said filters, for integrating said filtered signals, each integrator comprising an operational amplifier having one input signal connected to a fixed reference potential;

wherein an output of each integrator is coupled via an impedance element to an input of an adjacent integrator of said at least two integators.

2. Polyphase filter according to claim 1, wherein an output of one integrator of said at least two integrators is coupled via a conductance element to an input of an above integrator of the at least two integrators.

3. Polyphase filter according to claim 2, wherein an output of said one integrator of said at least two integrators is coupled via a capacitor to an input of a below integrator of said at least two integrators.

4. Polyphase filter according to claim 3, wherein said operational amplifier comprises an amplifier with an admittance element in a feedback path.

5. Polyphase filter according to claim 4, wherein each of said filters comprises a passive element selected from a group consisting of a resistor, an inductor and a capacitor, and wherein each of said amplifiers comprises an operational amplifier.

6. Polyphase filter according to claim 5, wherein a passive element comprises a resistor and a capacitor and wherein said admittance element comprises a capacitor and a conductance element coupled in parallel to each other.

7. Polyphase filter according to claim 6, wherein said polyphase filter comprises at least one signal inversion between said at least two integrators.

* * * * *